United States Patent
Sato (10) Patent No.: US 7,608,784 B2
(45) Date of Patent: Oct. 27, 2009

(54) PHOTOSENSITIVE CONDUCTIVE PASTE FOR ELECTRODE FORMATION AND ELECTRODE

(75) Inventor: Atsuhiko Sato, Kawasaka (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 14 days.

(21) Appl. No.: 11/486,249

(22) Filed: Jul. 13, 2006

(65) Prior Publication Data

US 2008/0011515 A1 Jan. 17, 2008

(51) Int. Cl.
*H01R 4/00* (2006.01)
(52) U.S. Cl. .................................. 174/94 R
(58) Field of Classification Search ............... 174/94 R, 174/102 SC
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,380,381 A | 4/1968 | Musgrave | |
| 3,427,161 A | 2/1969 | Laridon et al. | |
| 3,479,186 A | 11/1969 | Taylor et al. | |
| 3,549,367 A | 12/1970 | Chang et al. | |
| 3,583,931 A | 6/1971 | Bouchard | |
| 4,162,162 A | 7/1979 | Dueber | |
| 5,032,490 A | 7/1991 | Nebe et al. | |
| 6,333,140 B1 * | 12/2001 | Hatori et al. | 430/312 |
| 2002/0048730 A1 | 4/2002 | Hatori et al. | |
| 2002/0158235 A1 | 10/2002 | Kojima et al. | |
| 2005/0032254 A1 | 2/2005 | Cheng et al. | |
| 2005/0037278 A1 * | 2/2005 | Koishikawa et al. | 430/270.1 |
| 2005/0205290 A1 * | 9/2005 | Pinacci et al. | 174/121 A |

FOREIGN PATENT DOCUMENTS

| | | |
|---|---|---|
| JP | 10-073233 A | 3/1989 |
| JP | 195487 A | 7/2003 |
| JP | 3479463 | 12/2003 |
| JP | 2004-158456 | 3/2004 |
| JP | 3510761 | 3/2004 |
| JP | 3541125 | 4/2004 |
| JP | 3538387 | 6/2004 |
| JP | 3538408 | 6/2004 |
| WO | WO0203766 A2 | 1/2002 |
| WO | WO 2004/066364 A2 | 8/2004 |

* cited by examiner

*Primary Examiner*—Chau N Nguyen (57) ABSTRACT

A photosensitive conductive paste for electrode formation, containing conductive metal particles, a glass binder, a monomer, a photoinitiator, an organic polymer binder, an organic medium and carbon black.

7 Claims, 11 Drawing Sheets

Fig. 11

PHOTOSENSITIVE CONDUCTIVE PASTE FOR ELECTRODE FORMATION AND ELECTRODE

BACKGROUND OF THE INVENTION

1. Field of the Invention

The present invention relates to an electrode of a plasma display panel (PDP). More particularly, the present invention relates to a technology for improving exposure latitude and imparting improved PDP quality by modifying a photo-patternable paste.

2. Technical Background

PDP's include 1000 or more electrodes measuring 80 to 100 μm in width by 0.5 to 1.5 m in length. These electrodes are preferred to be free of defects and have superior linearity. Silver is typically used for the conductive metal particles contained in the electrodes.

Photolithography has recently become widely used to form the electrodes in PDP. In this method, a photo-patternable paste is first coated. A pattern is then formed by exposing and developing a film composed of the photo-patternable paste. Accompanying the increased size of glass substrates in recent years, proximity exposure has come to be used during exposure. Proximity exposure refers to a system whereby exposure is carried out while providing a gap of several hundred micrometers between a photomask and the coated film to be exposed.

In the case of pattern formation using a photo-patternable paste, it is desirable to increase the process latitude. Namely, it is desirable to increase the degree of freedom of the exposure conditions. In the case of low process latitude, the pattern shape may change easily depending on the exposure conditions, or the width of the electrodes may become uneven. Photosensitivity to changes in the pattern shape depending on exposure conditions signifies a low degree of freedom, and may even lead to restrictions on the production process. When carrying out proximity exposure, in particular, the width of the electrode formed tends to be greater than the designed electrode width, resulting in the decrease of sharpness of image, and countermeasures against this are desired.

Japanese Patent Application Laid-open No. 2003-195487 discloses a technology in which an ultraviolet absorber is added for the purpose of forming a fine, sharp transparent electrode. According to this publication, the addition of the ultraviolet absorber makes it possible to diminish scattering of exposure light within the paste. Examples of ultraviolet absorbers include azo-based dyes, amino ketone-based dyes, xanthene-based dyes, quinoline-based dyes, anthraquinone-based dyes, benzophenone-based dyes, diphenylcyanoacrylate-based dyes, triazine-based dyes and p-aminobenzoic acid-based dyes.

SUMMARY OF THE INVENTION

An object of the present invention is to provide means capable of achieving high pattern resolution even under exposure conditions which tend to cause an increase in electrode width, such as proximity exposure.

The present invention relates to a photosensitive conductive paste for electrode formation comprising: conductive metal particles, a glass binder, a monomer, a photoinitiator, an organic polymer binder, an organic medium and carbon black.

In addition, the present invention relates to an electrode formed using the above-mentioned conductive paste.

In addition, the present invention relates to a PDP having the above-mentioned electrode.

The invention further relates to a method for forming an electrode comprising the steps of: coating a photosensitive conductive paste for electrode formation on a substrate, said photosensitive conductive paste for electrode formation comprising conductive metal particles, a glass binder, a monomer, a photoinitiator, an organic polymer binder, an organic medium and carbon black; drying the coated conductive paste; exposing a film formed by drying the conductive paste using a photomask; obtaining an electrode pattern by developing the exposed film; and firing the resulting electrode pattern.

Use of the electrode paste of the present invention makes it possible to realize high resolution. In addition, the electrode paste of the present invention causes little fluctuations in resolution due to exposure conditions, and enhances the degree of freedom with respect to exposure conditions. Since the carbon black demonstrates effects even if added in a small amount, detrimental effects on the electrode caused by blending of additives can be minimized.

DETAILED DESCRIPTION OF THE INVENTION

A first aspect of the present invention relates to a photosensitive conductive paste for electrode formation comprising: conductive metal particles, a glass binder, a monomer, a photoinitiator, an organic polymer binder, an organic medium and carbon black.

The paste of the present invention is a photo-patternable paste. In other words, polymerization is induced by a photoinitiator as a result of coating a paste followed by exposure at a predetermined site. Normally, ultraviolet light is used. A pattern is formed by utilizing the difference in resolution between the site where polymerization progresses and the site where it does not.

It is preferable that optical scattering be low in the conductive paste surface layer and inside the conductive paste in order to improve resolution in photosensitive processes. If optical scattering occurs in the surface layer and inside the conductive paste, polymerization ends up proceeding even at sites which are not exposed, thereby resulting in pattern width deviating from the desired width. In extreme cases, adjacent lines end up being connected.

In the present invention, carbon black is contained in the paste. The carbon black prevents scattering of exposure light in the surface layer and within the paste, thereby resulting in the formation of a pattern of a desired shape and having high resolution.

In addition, the addition of carbon black increases the degree of freedom of the exposure conditions. This advantage is extremely significant in actual production settings. In the case of carrying out proximity exposure, inhibiting increases in pattern width by adding carbon black is particularly effective. The use of silver for the conductive metal particles in particular is extremely effective in the case of carrying out proximity exposure. Since silver has high light reflectance, although pattern width increases easily in the case of having carried out proximity exposure, applying the present invention realizes high resolution even in the case of carrying out proximity exposure using a silver paste.

There are no particular limitations on the gap when carrying out proximity exposure. The present invention can be applied to proximity exposure of, for example, 150 μm or more, or proximity exposure of 300 μm or more.

As described herein, an explanation is sequentially provided of the constituent components of the photosensitive conductive paste for electrode formation. The components indicated below can be used for the components other than the carbon black. However, the indicated components are only examples, and other components may also be used. In addition, said components may also be substituted with newly developed components or newly developed components may be added.

(A) Conductive Metal Particles

Conductive metal particle give conductivity to an electrode formed from a paste of the present invention. Such conductive metal particles include gold, silver, platinum, palladium, copper and combinations thereof. Virtually any shape metal powder, including spherical particles and flakes (rods, cones, and plates) may be used in the compositions of the present invention. The preferred metal powders are selected from the group comprising gold, silver, palladium, platinum, copper and combinations thereof. The most preferred metal powder is silver. Silver is commonly available and relatively inexpensive. The sintering temperature for silver is relatively low compared with other metal like gold. Furthermore, it is possible to sinter silver metal under an oxygen-containing atmosphere, such as air. It is preferred that the particles be spherical. It is preferred that at least 80 percent by weight of the conductive metal particles fall within a 0.5-10 μm range.

Based on the overall paste weight, the conductive metal particle content is typically 50-80 wt %.

(B) Glass Binder (Glass Frit)

The glass binder (glass frit) used in the present invention promotes the sintering of conductive component particles. From an environmental point of view, the glass binder is preferably a lead-free and cadmium-free Bi based amorphous, low-melting glass binder. Other lead-free, low-melting glasses are P based or Zn—B based compositions. However, P based glass does not have good water resistance, and Zn—B glass is difficult to obtain in the amorphous state, hence Bi based glasses are preferred. Bi glass can be made to have a relatively low melting point without adding an alkali metal and has little problems in making a powder. In the present invention, Bi glass having the following characteristics is most preferred.

Described, below, is one glass composition, for example. However, the present invention is not limited to that composition.

| (I) Glass composition | |
|---|---|
| 55-85 wt % | $Bi_2O_3$ |
| 0-20 wt % | $SiO_2$ |
| 0-5 wt % | $Al_2O_3$ |
| 2-20 wt % | $B_2O_3$ |
| 0-20 wt % | ZnO |
| 0-15 wt % | one or more of oxides selected from BaO, CaO, and SrO (in the case of an oxide mixture, the maximum total is up to 15 wt %). |
| 0-3 wt % | one or more of oxides selected from $Na_2O$, $K_2O$, $Cs_2O$ and $Li_2O$ (in the case of an oxide mixture, the maximum total is up to 3 wt %). |

Based on the overall paste weight, the glass binder content is typically 1-10 wt %. When the glass binder content is too small, bonding to the substrate is weak.

(C) Monomer

The monomer component useful in the present invention includes a compound containing at least one polymerizable ethylene group and a compound containing at least one addition-polymerizable ethylenically unsaturated group. The monomer is polymerized by the exposure of light.

The chain-extending addition polymerization of these compounds is induced by free radicals. The monomeric compounds are not gaseous, i.e., having boiling point higher than 100° C. The monomeric compounds have plasticizing effects on the organic polymeric binders.

Preferred monomers that can be used alone or in combination with other monomers include t-butyl(meth)acrylate, 1,5-pentanediol di(meth)acrylate, N,N-dimethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, compounds described in U.S. Pat. No. 3,380,381, 2,2-di(p-hydroxyphenyl)propane di(meth)acrylate, pentaerythritol tetra(meth)acrylate, triethylene glycol diacrylate, polyoxyethylene-1,2-di(p-hydroxyethyl)propane dimethacrylate, bisphenol A di[3-(meth)acryloyloxy-2-hydroxypropyl]ether, bisphenol A di[2-(meth)acryloyloxyethyl]ether, 1,4-butanediol di(3-methacryloyloxy-2-hydroxypropyl)ether, triethylene glycol dimethacrylate, polyoxyporpyltrimethylolpropane triacrylate, butylenes glycol di(meth)acrylate, 1,2,4-butanediol[sic] tri(meth)acrylate, 2,2,4-trimethyl-1,3-pentanediol di(meth)acrylate, 1-phenylethylene 1,2-dimethacrylate, diallyl fumarate, styrene, 1,4-benzenediol dimethacrylate, 1,4-di-isopropenylbenzene, and 1,3,5-triisopropenylbenzene [(meth)acrylate means both acrylate and methacrylate].

Other useful monomers are ethylenically unsaturated compounds, having molecular weights below 300, e.g., an alkylene or polyalkylene glycol diacrylate prepared from an alkylene glycol or polyalkylene glycol, such as a 1-10 ether bond-containing $C_{2-15}$ alkylene glycol, and those described in U.S. Pat. No. 2,927,022, such as those containing a terminal addition-polymerizable ethylene bond.

Other preferred monomers are polyoxyethylenated trimethylolpropane tri(meth)acrylate, ethylated pentaerythritol acrylate, trimethylolpropane tri(meth)acrylate, dipentaerythritol monohydroxypentacrylate, and 1,10-decanediol dimethacrylate.

Other preferred monomers are monohydroxypolycaprolactone monoacrylate, polyethylene glycol diacrylate (molecular weight: about 200), and polyethylene glycol dimethacrylate (molecular weight: about 400). The unsaturated monomer component content is 1-20 wt % based on the overall weight of the dry photopolymerizable layer.

Other useful monomers are disclosed in U.S. Pat. No. 5,032,490, incorporated herein by reference.

Based on the overall paste weight, the monomer content is typically 3-10 wt %.

(D) Photoinitiators

Suitable photoinitiators are thermally inert but generate free radicals when exposed to actinic radiation at a temperature below 185° C. These photoinitiators are compounds having two intramolecular rings inside a conjugated carbon ring system and include (un)substituted polynuclear quinines, e.g., 9,10-anthraquinone, 2-methylanthraquinone, 2-ethylanthraquinone, 2-t-butylanthraquinone, octamethylanthraquinone, 1,4-naphthoquinone, 9,10-phenanthrene-quinone, benz[a]anthracene-7,12-dione, 2,3-naphthacene-5, 12-dione, 2-methyl-1,4-naphthoquinone, 1,4-dimethylanthraquinone, 2,3-dimethylanthraquinone, 2-phenylanthraquinone, 2,3-diphenylanthraquinone, retenquinone [transliteration], 7,8,9,10-tetrahydronaphthacene-5, 12-dione, and 1,2,3,4-tetrahydrobenz[a]anthracene-7,12-dione. Other useful photoinitiators are described in U.S. Pat. No. 2,760,863 [Of these, some are thermally active at a low temperature of 85° C., such as vicinal ketaldonyl alcohols, e.g., benzoin and pivaloin; acyloin ethers such as benzoin methyl or ethyl ether; α-methylbenzoin, α-allylbenzoin, α-phenylbenzoin, thioxanthone and its derivatives, hydrogen donors, hydrocarbon-substituted aromatic acyloin, etc.]

Based on the overall paste weight, the photoinitiator content is typically 5-15 wt %.

(E) Organic Polymer Binders

The polymeric binders are important in the compositions of the present invention and are preferably selected considering their water developability and high resolution. Such requirements are satisfied by binders of the following compositions. Such binders may be copolymers and interpolymers (mixed polymers) made from (1) non-acidic comonomers such as $C_{1-10}$ alkyl acrylates, $C_{1-10}$ alkyl methacrylates, styrene, substituted styrene, or combinations thereof, and (2) acidic comonomers including an ethylenically unsaturated carboxylic acid in at least 15 wt % of the total polymer weight.

With such an acidic functional group, development in an aqueous base, such as a 0.4 wt % sodium carbonate aqueous solution, is possible. If the acidic comonomer content is less than 15 wt %, the composition may not be washed off completely by the aqueous base. If the acidic comonomer content is above 30%, the composition has low stability under the development conditions and the image area is only partially developed. Suitable acidic comonomers may be ethylenically unsaturated monocarboxylic acids such as acrylic acid, methacrylic acid, crotonic acid, etc.; ethylenically unsaturated dicarboxylic acids such as fumaric acid, itaconic acid, citraconic acid, vinylsuccinic acid, maleic acid, etc., their half esters (hemiesters), as well as sometimes their anhydrides and mixtures. For clean burning under a low-oxygen atmosphere, methacrylic polymers are preferred over acrylic polymers.

When the non-acidic comonomers are the alkyl acrylates or alkyl methacrylates described above, the non-acidic comonomer content in the polymeric binders is preferred to be typically at least 50 wt %, preferably 70-75 wt %. When the non-acidic comonomers are styrene or substituted styrene, the non-acidic comonomer content in the polymeric binder is preferred to be typically 50 wt %, with the remaining 50 wt % being an acid anhydride such as maleic anhydride hemiester. The preferred substituted styrene is α-methylstyrene.

While not preferred, the non-acidic portion of the polymeric binder may contain less than about 50 wt % of other non-acidic comonomers substituting the alkyl acrylate, alkyl methacrylate, styrene, or substituted styrene portion of the polymer. For example, they include acrylonitrile, vinyl acetate, and acrylamide. However, in such cases, complete combustion is more difficult, thus such a monomer content should be less than about 25 wt % of the overall polymeric binder weight. Binders may consist of a single copolymer or combinations of copolymers fulfilling various standards described above. In addition to the copolymers described above, other examples include polyolefins such as polyethylene, polypropylene, polybutylene, polyisobutylene, ethylene-propylene copolymer, etc., as well as polyethers such as lower alkylene oxide polymers including polyethylene oxide.

These polymers can be prepared by solution polymerization technology commonly used in the acrylic acid ester polymerization field.

Typically, the acidic acrylic acid ester polymers described above can be obtained by mixing an α- or β-ethylenically unsaturated acid (acidic comonomer) with one or more copolymerizable vinyl monomers (non-acidic comonomer) in an organic solvent having a relatively low boiling point (75-150° C.) to obtain a 10-60% monomer mixture solution, then adding a polymerization catalyst to the monomer, followed by polymerization. The resulting mixture is heated under ambient pressure at the reflux temperature of the solvent. After completion of the polymerization reaction, the resulting acidic polymer solution is cooled to room temperature. A sample is recovered and measured for the polymer viscosity, molecular weight, and acid equivalent.

The acid-containing polymeric binder described above is preferred to have a molecular weight below 50,000.

When such compositions are coated by screen printing, the polymeric binder is preferred to have a Tg (glass transition temperature) exceeding 60° C.

Based on the overall paste weight, the polymer binder content is typically 10-30 wt %.

(F) Organic Medium

The organic medium is mainly used for the easy coating of dispersions containing a finely pulverized composition on ceramics and other substrates. Thus, first, the organic medium is preferred to be capable of dispersing the solid components in a stable manner and, second, the rheological property of the organic medium is to impart good coatability to the dispersion.

In the organic medium, the solvent component that may be a solvent mixture is preferred to be selected from those capable of complete dissolution of polymers and other organic components. The solvents are selected from those that are inert (not reactive) with respect to the paste composition components. Solvents are selected from those that have a sufficiently high volatility, thus evaporate well from the dispersion even when coated under ambient pressure at a relatively low temperature, while in the case of the printing process, the volatility is preferred not be too high, causing rapid drying of the paste on the screen at room temperature. Solvents that can be favorably used in the paste compositions is preferred to have boiling point below 300° C. under ambient pressure, preferably below 250° C. Such solvents may be aliphatic alcohols or their esters such as acetic acid esters or propionic acid esters; terpenes such pine resin, α- or β-terpineol, or mixtures thereof; ethylene glycol, ethylene glycol monobutyl ether, and ethylene glycol esters such as butyl Cellosolve acetate; butyl Carbitol and Carbitol esters such as butyl Carbitol acetate and Carbitol acetate; Texanol (2,2,4-trimethyl-1,3-pentanediol monoisobutyrate), and other suitable solvents.

Based on the overall paste weight, the organic medium content is typically 2040 wt %.

(G) Carbon Black

Various types of carbon black can be used for the carbon black. Commercially available carbon black may also be used. Examples of commercially available carbon black products which can be used include Monarch®700 manufactured by Cabot.

There are no particular limitations on the physical properties of the carbon black. For example, the specific surface area of the carbon black is preferably 50 to 1000 m$^2$/g, and the use of fine particles having a specific surface area of 200 m$^2$/g or more enables the paste to be colored black even while adding only a small amount of carbon black, thereby decreasing the difference in line width with the photomask and making the line edges more distinct.

The amount of carbon black added is preferably 0.01 to 0.5 wt %, and more preferably 0.05 to 0.2 wt %, based on the total paste weight. Since carbon black has considerable ultraviolet absorption effects, adequate effects can be obtained with the addition of an extremely small amount. As a result, the effects of additives on various characteristics can be minimized. Moreover, since carbon black is extremely inexpensive in comparison with other ultraviolet absorbers, it also contributes to reduction of production costs.

If the ultraviolet absorption effects of the carbon black are excessively great, the exposure light is unable to adequately reach beneath the coated paste, thereby resulting in the risk of the pattern shape deviating from the desired size. Conversely, if the added amount is insufficient, there is the risk of the effects of the carbon black being unable to be adequately obtained. Thus, the optimum amount is determined in consideration of these factors.

(H) Additional Components

These additional components are dispersants, stabilizers, plasticizers, releases, stripping agents, defoamers, wetting agents, etc., that are known in the art. Such materials are disclosed in U.S. Pat. No. 5,032,490 herein incorporated by reference.

The paste of the present invention is used for form an electrode. For example, it is used to form an electrode of a plasma display panel (PDP). Although PDP have back panel electrodes and front panel electrodes, the present invention can be applied to either thereof. Since known technologies can be applied with respect to PDP structure and PDP production methods, an explanation thereof is omitted here.

A second aspect of the present invention is a method for forming an electrode comprising the steps of: coating a photosensitive conductive paste for electrode formation on a substrate, said photosensitive conductive paste for electrode formation comprising conductive metal particles, a glass binder, a monomer, a photoinitiator, an organic polymer binder, an organic medium and carbon black, which does not substantially change the reflectance of the paste in the visible light range; drying the coated conductive paste; exposing a film formed by drying the conductive paste using a photomask; obtaining an electrode pattern by developing the exposed film; and firing the resulting electrode pattern.

A typical method for forming an electrode is summarized below.

First, a photosensitive conductive paste for electrode formation, comprising conductive metal particles, a glass binder, a monomer, a photoinitiator, an organic polymer binder, an organic medium and carbon black, is coated onto a substrate. Since the conductive paste was previously described, an explanation thereof is omitted here.

The substrate on which the conductive paste is coated may be selected considering the application. For example, in the case of forming a back panel electrode of a PDP, the paste is coated onto a back glass panel. The entire surface is coated by screen printing, for example, during coating.

Next, the coated conductive paste is dried. Although there are no particular limitations on the drying conditions provided the conductive paste is able to be dried, the conductive paste may be dried, for example, for 10 to 20 minutes at 100° C. In addition, drying can be carried out using, for example, a conveyor-type infrared dryer. The electrode thickness after drying is normally 8 to 10 μm in a PDP.

The film of the dried conductive paste is exposed using a photomask. The photomask has an electrode pattern which is desired to be formed, and light is radiated onto the desired pattern by exposing through the photomask. There are no particular limitations on the wavelength of the light used during exposure, and the i-line (365 nm), for example, can be used. Exposure conditions vary according to the components of the paste used, the film thickness thereof and so forth. Although there are no particular limitations on the exposure level, it is normally from 100 to 1000 mJ/cm$^2$.

In the present invention, the step for exposing the film is preferably proximity exposure. The effects obtained by the carbon black are significant in proximity exposure. These effects are particularly significant in the case of proximity exposure at a gap of 300 μm or more. In addition, the present invention is significant in the case of using silver for the conductive metal particles, as previously described.

A pattern is obtained by developing the exposed film. Development can be carried out with an alkaline solution. A 0.4% aqueous sodium carbonate solution, for example, can be used for the alkaline solution. A developed electrode pattern can be obtained by using a means such as spraying this type of alkaline solution onto the film on the substrate, or immersing the substrate having the exposed film into an alkaline solution.

Finally, the developed electrode pattern is fired. Firing can be carried out in a firing oven having a predetermined temperature profile. The maximum temperature during firing is preferably 400 to 600° C., and more preferably 500 to 600° C. The firing time is preferably 1 to 3 hours. After firing, an electrode having a desired pattern is obtained by cooling. The thickness of the electrode after drying is normally 4 to 5 μm.

EXAMPLES

Example 1

8 parts by weight of an organic resin binder capable of being developed with an aqueous alkaline solution (copolymer of methyl methacrylate and methacrylic acid, acid value: 120 mgKOH/g, weight average molecular weight: 6400), 1.2 parts by weight of a photoinitiator (1:1 mixture of 2-methyl-1-[4-(methylthio)phenyl]-2-morpholinopropan-1-one and ethyl-4-dimethylaminobenzoate), 0.5 parts by weight of a photosensitizer (2,4-diethylthioxanthone), 0.3 parts by weight of a thickener (copolymer of polyvinyl pyrrolidone and vinyl acetate), and 0.02 parts by weight of a thermal polymerization inhibitor (1,4,4-trimethyl-2,3-diazobicyclo[3.2.2]non-2-ene-N,N'-dioxide) were dissolved in 16 parts by weight of an organic medium (texanol). 6 parts by weight of a reactive monomer (trimethylol propane triacrylate), 0.2 parts by weight of a viscosity stabilizer (malonic acid), 0.03 parts by weight of carbon black, 1.0 parts by weight of a glass binder (softening point: 410° C., PbO—$Bi_2O_3$—$B_2O_3$) and 73 parts by weight of conductive metal particles in the form of silver particles (specific surface area: 0.5 $m^2$/g) were stirred into this solution. Subsequently, the mixture was formed into a photosensitive conductive paste for electrode formation by kneading with a three-roll mixer.

Example 2

A photosensitive conductive paste for electrode formation was obtained in the same manner as Example 1 with the exception of changing the amount of carbon black added to 0.05 parts by weight.

Example 3

A photosensitive conductive paste for electrode formation was obtained in the same manner as Example 1 with the exception of changing the amount of carbon black added to 0.08 parts by weight.

Comparative Example 1

A photosensitive conductive paste for electrode formation was obtained in the same manner as Example 1 with the exception of not adding carbon black.

Evaluation

Figure 1:
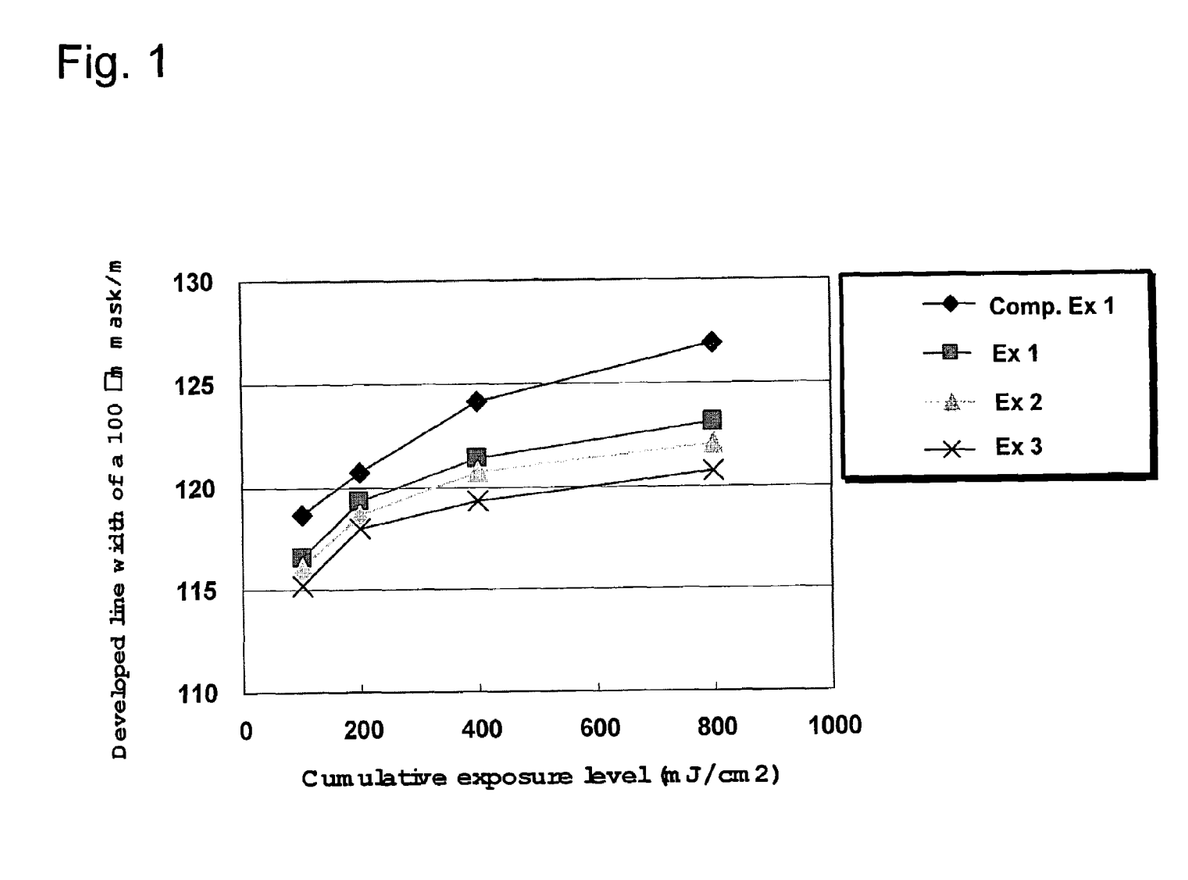
FIG. 1 is a graph showing the relationship between exposure level and line width after development.

PDP electrodes were produced under the following process conditions using the pastes of Examples 1, 2 and 3 and Comparative Example 1 followed by an evaluation of the characteristics thereof. The results are shown in FIG. 1 and Table 1.

i) Coating: Coating was carried out by printing with a 400 stainless steel mesh screen on a high strain point glass substrate measuring 5 cm×7.5 cm.

ii) Drying: Drying was carried out by maintaining at a temperature of 100° C. for 15 minutes in an IR oven.

iii) Exposure: Proximity exposure was carried out with an ultraviolet exposure device equipped with a high-pressure mercury lamp for the light source under two sets of conditions consisting of off contact amounts of 300 μm and 500 μm. Negative masks having line groups of 10 μm to 80 μm were used for the photomasks. The cumulative exposure level was 600 mJ/$cm^2$.

iv) Development: Development was carried out for 17 seconds in a 0.4% aqueous sodium carbonate solution maintained at a temperature of 30° C. using a conveyor-type developer. The developing time (17 seconds) was made to be roughly twice the amount of time (break) required to remove the film from the unexposed portion.

v) The resolution of the developed lines and the line widths were measured using a light microscope type of length measuring instrument to estimate the line width aberration from the exposure mask.

TABLE 1

| | Comparative Example 1 | Example 1 | Example 2 | Example 3 |
|---|---|---|---|---|
| Amount of carbon black added (part by weight) | None | 0.03 | 0.05 | 0.08 |

TABLE 1-continued

| | | Comparative Example 1 | Example 1 | Example 2 | Example 3 |
|---|---|---|---|---|---|
| Exposure level (mJ/$cm^2$) | 100 | 118.6 μm | 116.6 μm | 116.0 μm | 115.2 μm |
| | 200 | 120.7 μm | 119.3 μm | 118.6 μm | 117.9 μm |
| | 400 | 124.1 μm | 121.4 μm | 120.7 μm | 119.3 μm |
| | 800 | 126.9 μm | 123.1 μm | 122.1 μm | 120.7 μm |

As shown in Table 1 and FIG. 1, in Comparative Example 1 to which carbon black was not added, the difference between the mask and pattern width increased greatly as the exposure level was increased. On the other hand, in Examples 1 to 3 in which carbon black was added, the increase in pattern width when the exposure level was increased was less than that of Comparative Example 1. On the basis of these results, the addition of carbon black was suggested to increase the degree of freedom of exposure conditions. In addition, edge sharpness improved and resolution increased.

Figure 2:
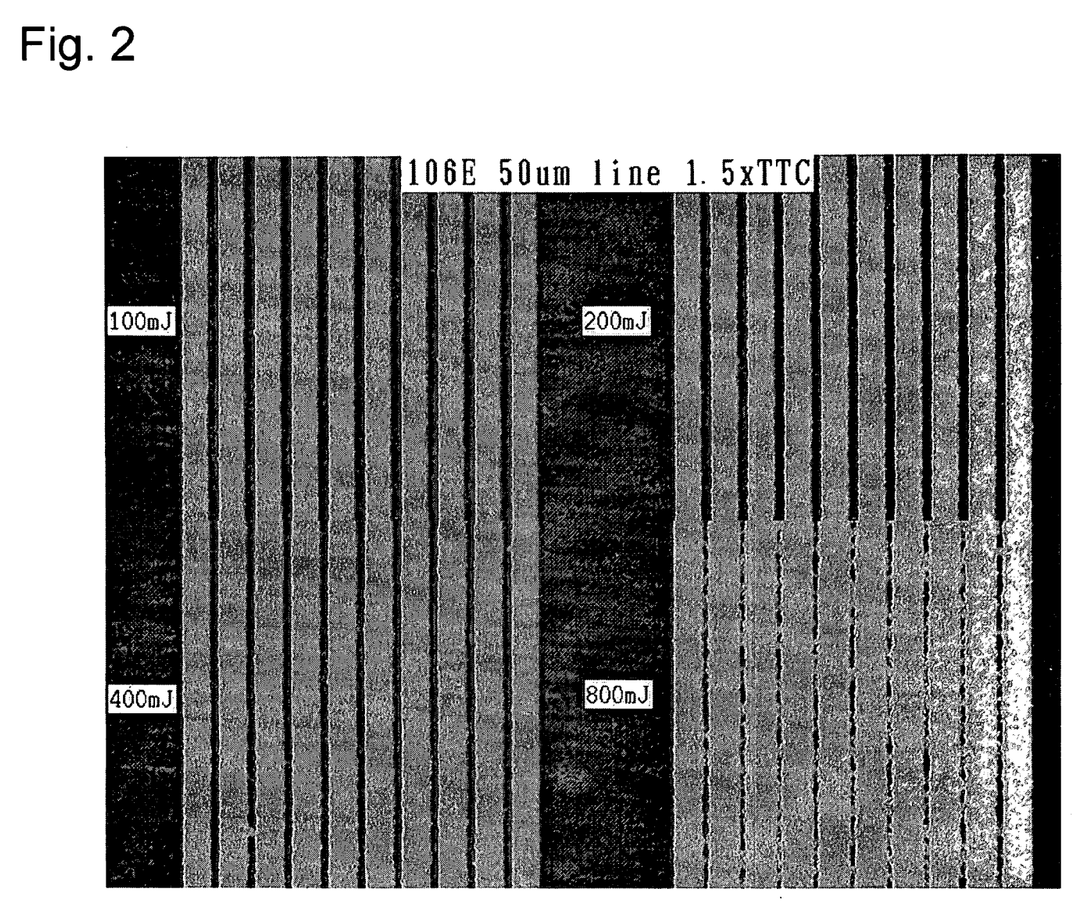
FIG. 2 is a photograph of the pattern of Comparative Example 1.
Figure 3:
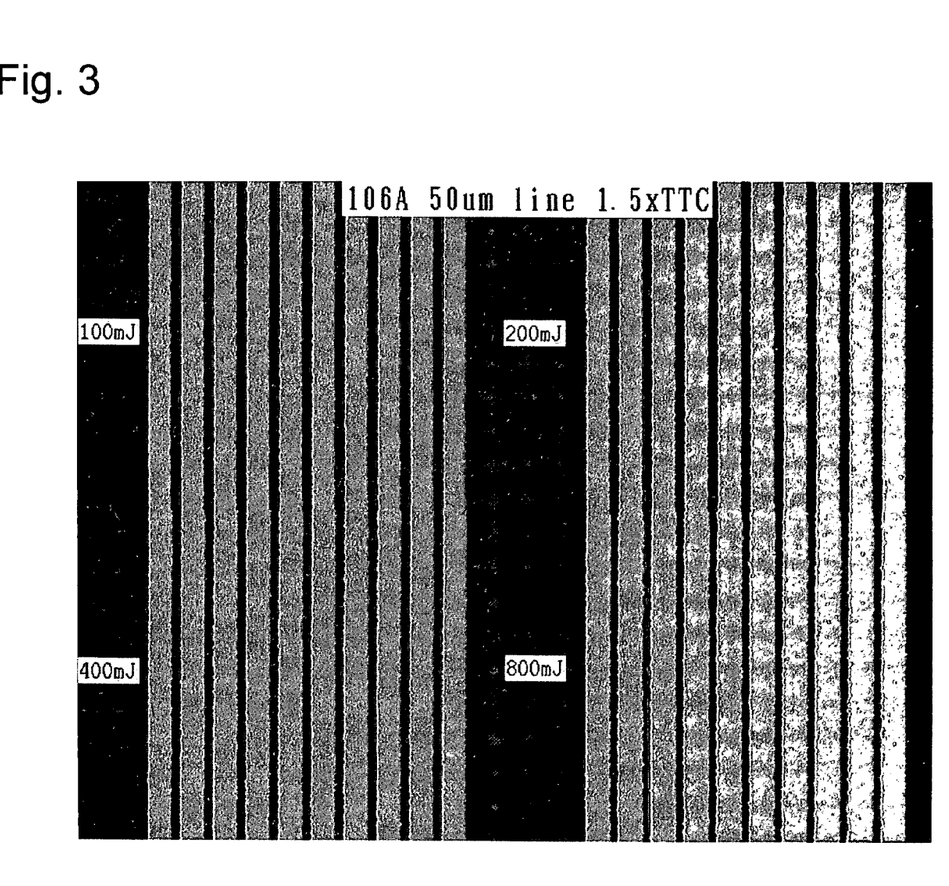
FIG. 3 is a photograph of the pattern of Example 1.
Figure 4:
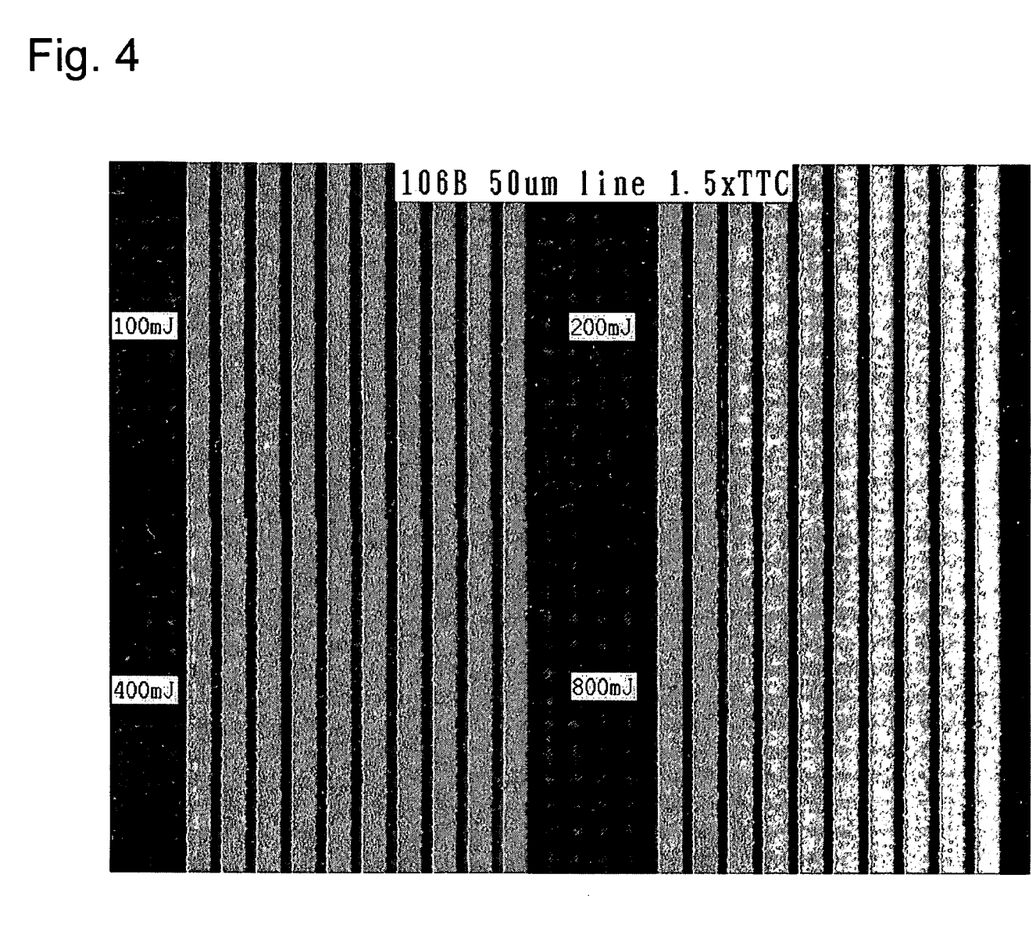
FIG. 4 is a photograph of the pattern of Example 3.
Figure 5:
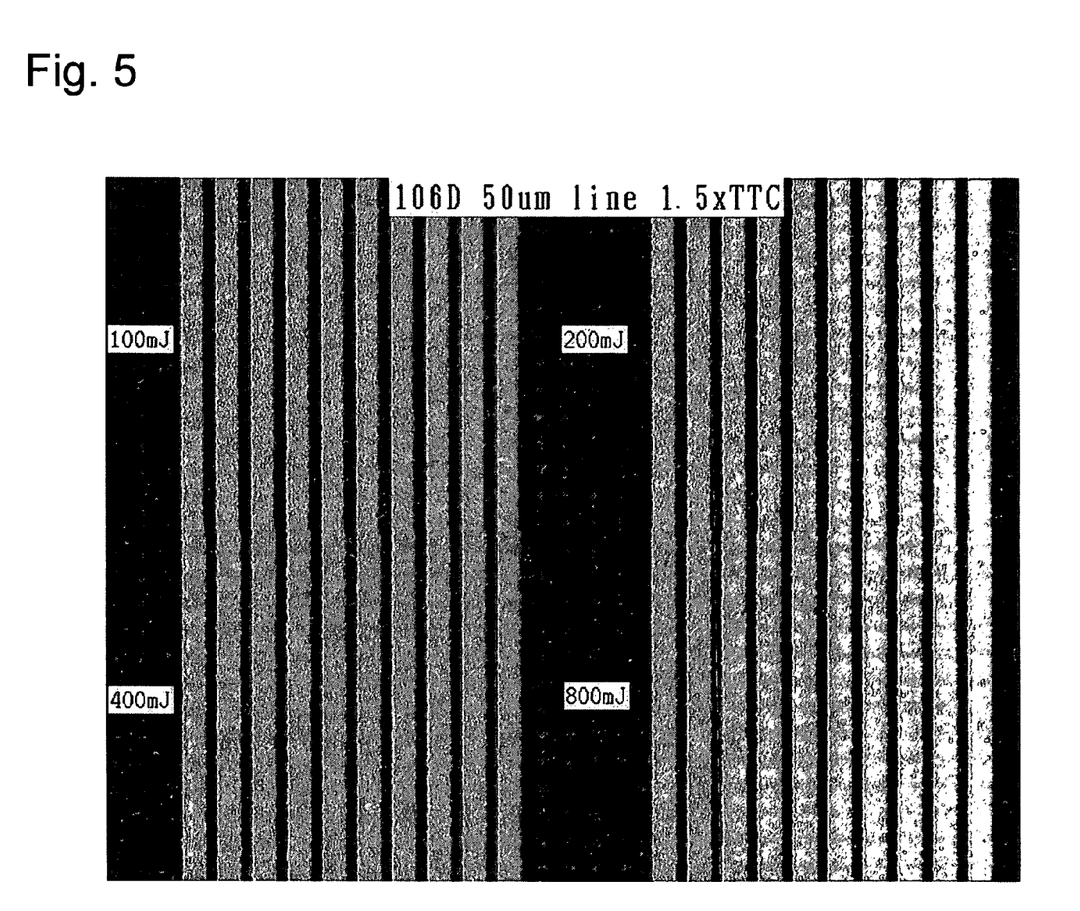
FIG. 5 is a photograph of the pattern of Example 4.

Photographs of the patterns of Comparative Example 1 and Examples 1 to 3 are shown in FIGS. 2 to 5 for reference purposes. FIG. 2 is a photograph of the pattern of Comparative Example 1. FIG. 3 is a photograph of the pattern of Example 1. FIG. 4 is a photograph of the pattern of Example 3. FIG. 5 is a photograph of the pattern of Example 4. As shown in FIG. 2 to 5, the addition of carbon black can be seen to result in narrow line thickness even if the exposure level is increased.

In order to investigate the effects of the addition of carbon black on electrical characteristics, the film thickness, resistance and specific resistance after firing were investigated for the patterns of Examples 1 to 3 and Comparative Example 1. Those results are shown in Table 2.

TABLE 2

Electrical characteristics of 100 μm line with the length of 4 cm fired at 550° C.

| | Comp. Ex. 1 | Ex. 1 | Ex. 2 | Ex. 3 |
|---|---|---|---|---|
| Amount of carbon black added (parts by weight) | None | 0.03 | 0.05 | 0.08 |
| Dry film thickness | 7.9 | 7.5 | 7.6 | 7.7 |
| Resistance (Ω) | 3.06 | 3.20 | 3.19 | 3.20 |
| Specific resistance based on film thickness of 5 μm (mΩ/$cm^2$) | 6.3 | 6.3 | 6.3 | 6.3 |

As shown in Table 2, the amounts of carbon black added were extremely small, and effects on pattern electrical characteristics following firing were not confirmed.

Example 4

8 parts by weight of an organic resin binder capable of being developed with an aqueous alkaline solution (copolymer of methyl methacrylate and methacrylic acid, acid value: 120 mgKOH/g, weight average molecular weight: 6400), 1.2 parts by weight of a photoinitiator (1:1 mixture of 2-methyl-1-[4-(methylthio)phenyl]-2-morpholinopropan-1-one and ethyl-4-dimethylaminobenzoate), 0.5 parts by weight of a photosensitizer (2,4-diethylthioxanthone), 0.3 parts by weight of a thickener (copolymer of polyvinyl pyrrolidone and vinyl acetate), and 0.02 parts by weight of a thermal polymerization inhibitor (1,4,4-trimethyl-2,3-diazobicyclo[3.2.2]non-2-ene-N,N'-dioxide) were dissolved in 16 parts by weight of an organic medium (texanol). 6 parts by weight of a reactive monomer (trimethylol propane triacrylate), 0.2 parts by weight of a viscosity stabilizer (malonic acid), 0.05 parts by weight of carbon black, 1.0 parts by weight of a glass binder (softening point: 550° C., average particle diameter: 0.8 µm, $Bi_2O_3$—$SiO_2$—$B_2O_3$) and 66 parts by weight of conductive metal particles in the form of silver particles (specific surface area: 0.5 $m^2/g$) were stirred into this solution. Subsequently, the mixture was formed into a photosensitive conductive paste for electrode formation by kneading with a three-roll mixer.

Example 5

A photosensitive conductive paste for electrode formation was obtained in the same manner as Example 4 with the exception of changing the amount of carbon black added to 0.08 parts by weight.

Example 6

A photosensitive conductive paste for electrode formation was obtained in the same manner as Example 4 with the exception of changing the amount of carbon black added to 0.10 parts by weight.

Example 7

A photosensitive conductive paste for electrode formation was obtained in the same manner as Example 4 with the exception of changing the amount of carbon black added to 0.15 parts by weight.

Example 8

A photosensitive conductive paste for electrode formation was obtained in the same manner as Example 4 with the exception of changing the amount of carbon black added to 0.20 parts by weight.

Comparative Example 2

A photosensitive conductive paste for electrode formation was obtained in the same manner as Example 4 with the exception of not adding carbon black.

Evaluation

PDP electrodes were produced under the following process conditions using the pastes of Examples 4 to 8 and Comparative Example 2 followed by an evaluation of the characteristics thereof. Furthermore, two types of electrodes were produced, consisting of a single layer type, in which a silver electrode was formed on a substrate, and a two-layer type, in which a silver electrode was formed on a black electrode. The results are shown in Tables 3 and 4.

i) Coating: Coating was carried out by printing with a 400 stainless steel mesh screen on a high strain point glass substrate measuring 5 cm×7.5 cm.

ii) Drying: Drying was carried out by maintaining at a temperature of 100° C. for 15 minutes in an IR oven.

iii) Exposure: Proximity exposure was carried out with an ultraviolet exposure device equipped with a high-pressure mercury lamp for the light source at off contact amounts of 300 µm and 500 µm through negative masks having line groups of 10 µm to 80 µm, and at a cumulative exposure level of 600 $mJ/cm^2$.

iv) Development: Development was carried out for 17 seconds in a 0.4% aqueous sodium carbonate solution maintained at a temperature of 30° C. using a conveyor-type developer. The developing time (17 seconds) was made to be roughly twice the amount of time (break) required to remove the film from the unexposed portion.

v) The resolution of the developed lines and the line widths were measured using a light microscope type of length measuring instrument to estimate the line width aberration from the exposure mask.

TABLE 3

Line Width Aberration Between 70 µm Lines of a Silver Single Layer Portion and Mask After Development (at exposure level of 600 $mJ/cm^2$)

|  | Comp. Ex. 2 | Ex. 4 | Ex. 5 | Ex. 6 | Ex. 7 | Ex. 8 |
|---|---|---|---|---|---|---|
| Amount of carbon black added to photosensitive silver paste (parts by weight) | None | 0.05 | 0.08 | 0.10 | 0.15 | 0.20 |
| After developing at off contact of 300 µm | 51 | 38 | 28 | 25 | 23 | 20 |
| After developing at off contact of 500 µm | 76 | 53 | 46 | 40 | 36 | 33 |

TABLE 4

Line Width Aberration Between 70 µm Lines of a Silver/Black Two-Layer Portion and Mask After Development (at exposure level of 600 $mJ/cm^2$)

|  | Comp. Ex. 2 | Ex. 4 | Ex. 5 | Ex. 6 | Ex. 7 | Ex. 8 |
|---|---|---|---|---|---|---|
| Amount of carbon black added to photosensitive silver paste (parts by weight) | None | 0.05 | 0.08 | 0.10 | 0.15 | 0.20 |
| After developing at off contact of 300 µm | 31 | 30 | 23 | 23 | 20 | 17 |
| After developing at off contact of 500 µm | 49 | 43 | 37 | 37 | 33 | 30 |

As shown in Tables 3 and 4, although normally line width increases and accuracy with respect to the design of the original mask decreases when the exposure level is increased as in Comparative Example 2, in Examples 4 to 8, the amount of change in the line width decreased and accuracy with respect to the mask increased when the amount of carbon black was increased. In addition, edge sharpness improved and resolution increased.

Although the effects of adding carbon black are remarkable in the case of a single layer, effects resulting from the addition of carbon black were also confirmed in a system in which a silver electrode was formed on a black electrode.

Figure 6:
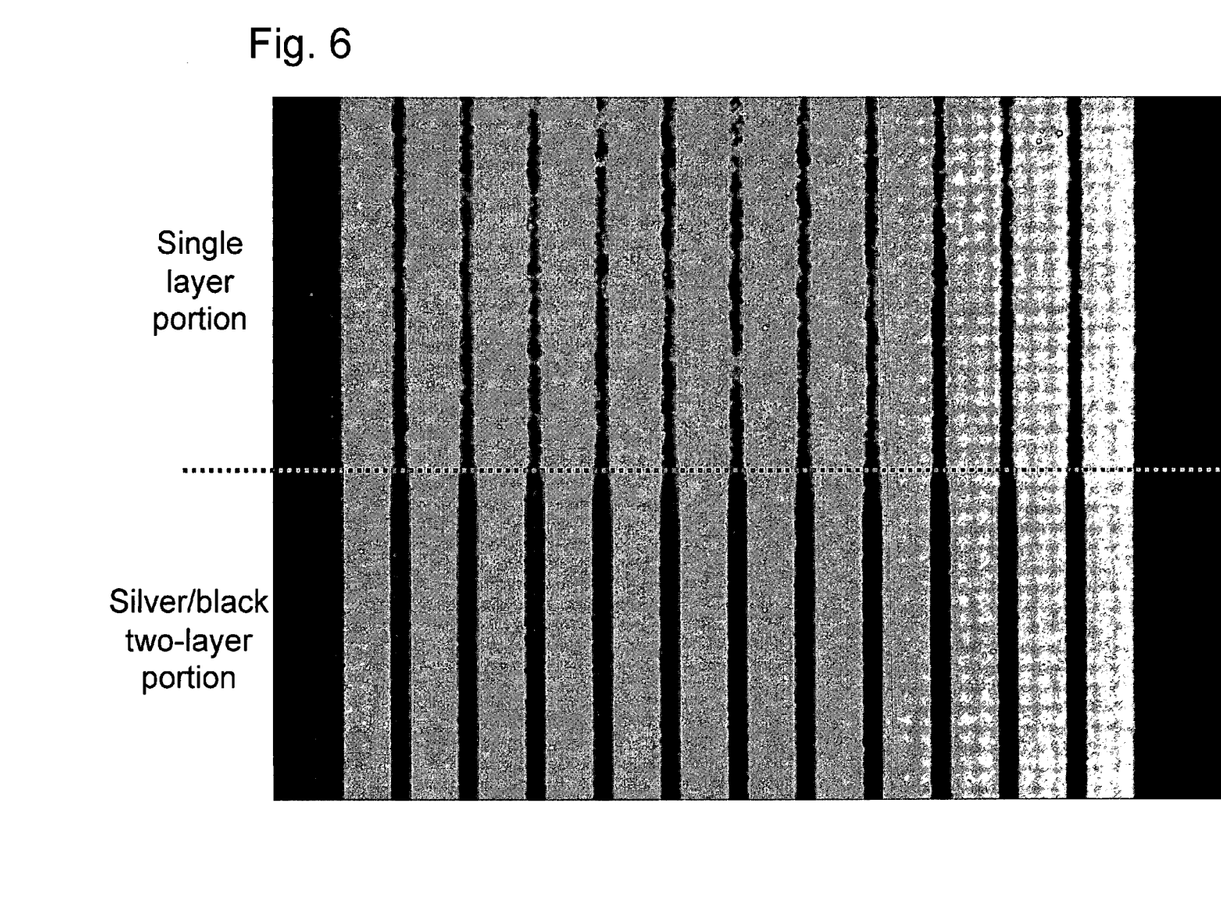
FIG. 6 is a photograph of the pattern of Comparative Example 2. The top portion indicates a single layer, and the bottom portion indicates a double layer.
Figure 7:
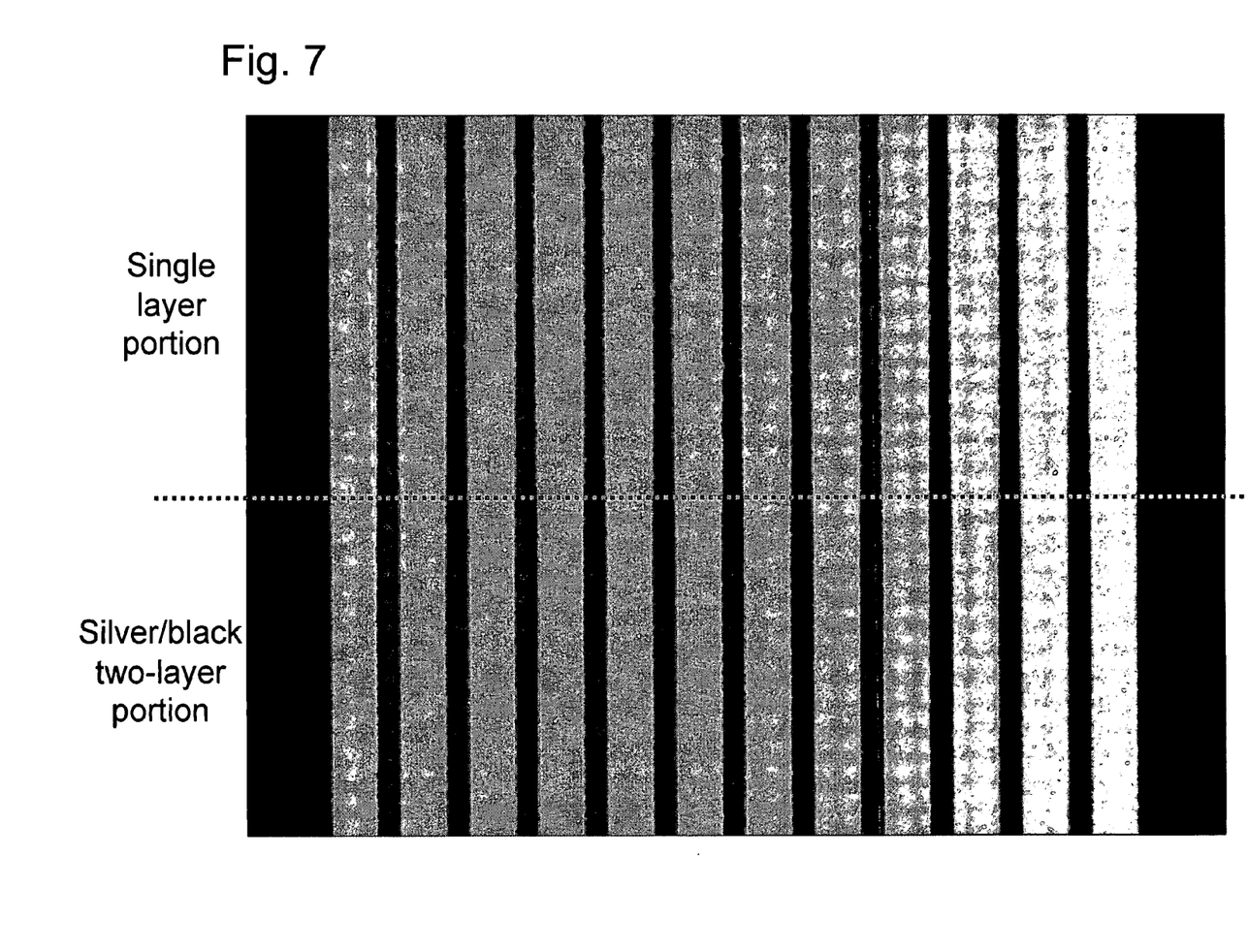
FIG. 7 is a photograph of the pattern of Example 4. The top portion indicates a single layer, and the bottom portion indicates a silver/black two layer portion.
Figure 8:
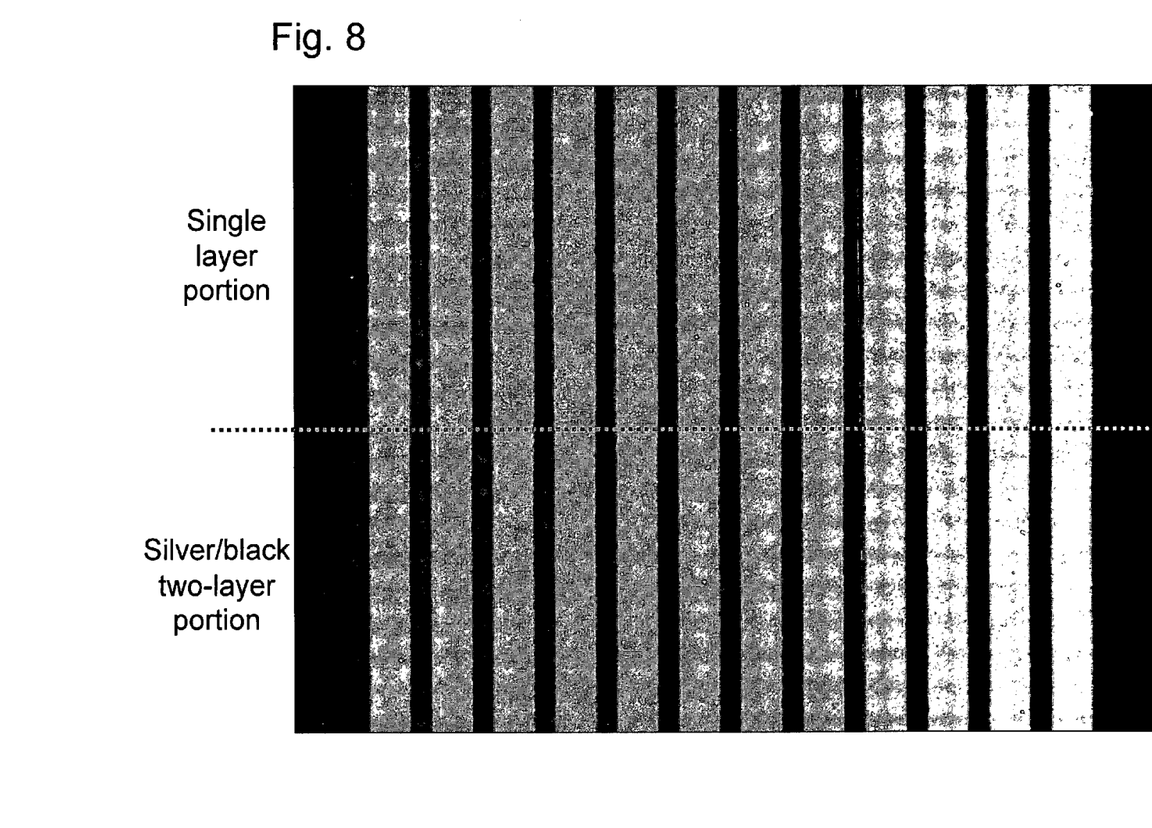
FIG. 8 is a photograph of the pattern of Example 5. The top portion indicates a single layer, and the bottom portion indicates a silver/black two layer portion.
Figure 9:
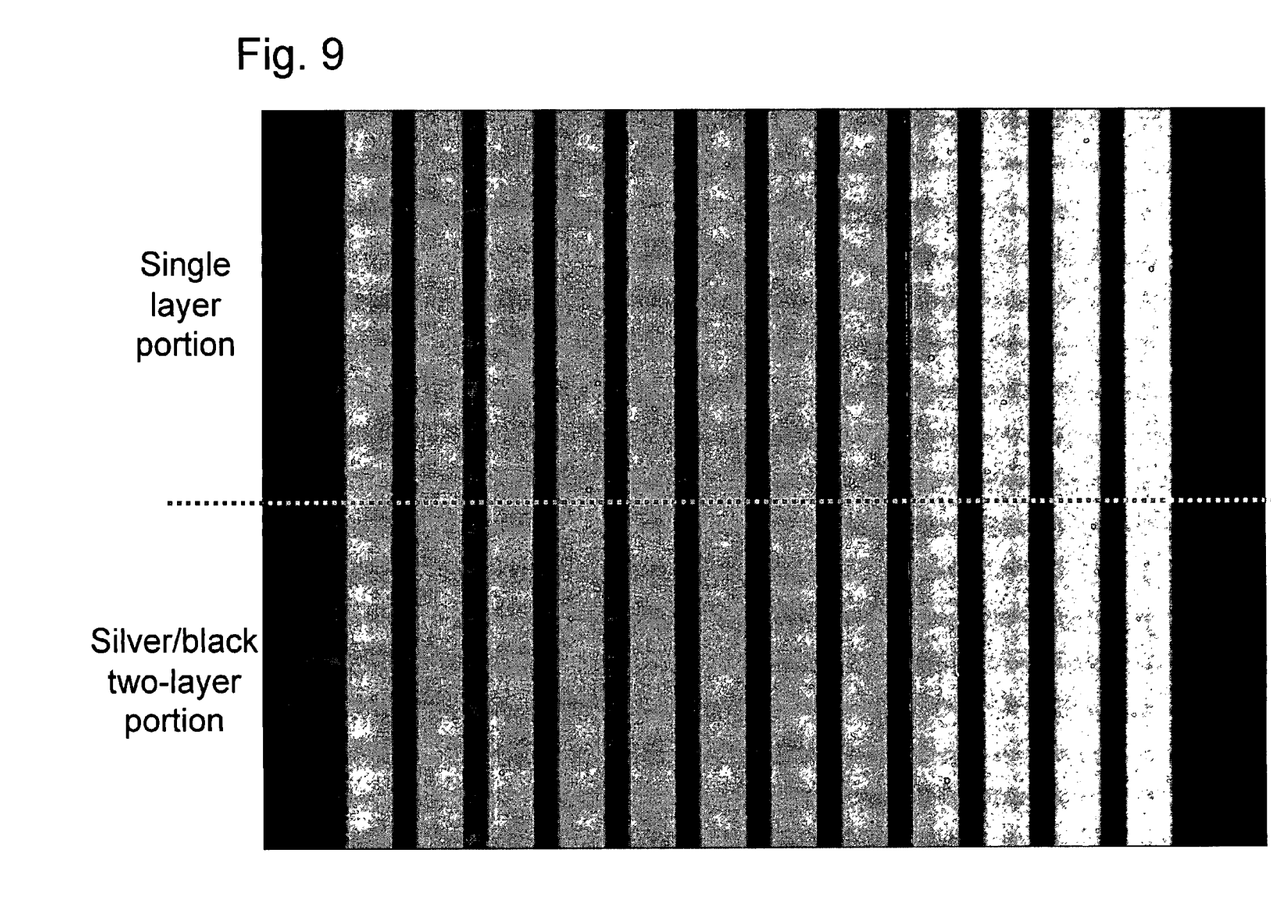
FIG. 9 is a photograph of the pattern of Example 6. The top portion indicates a single layer, and the bottom portion indicates a silver/black two layer portion.
Figure 10:
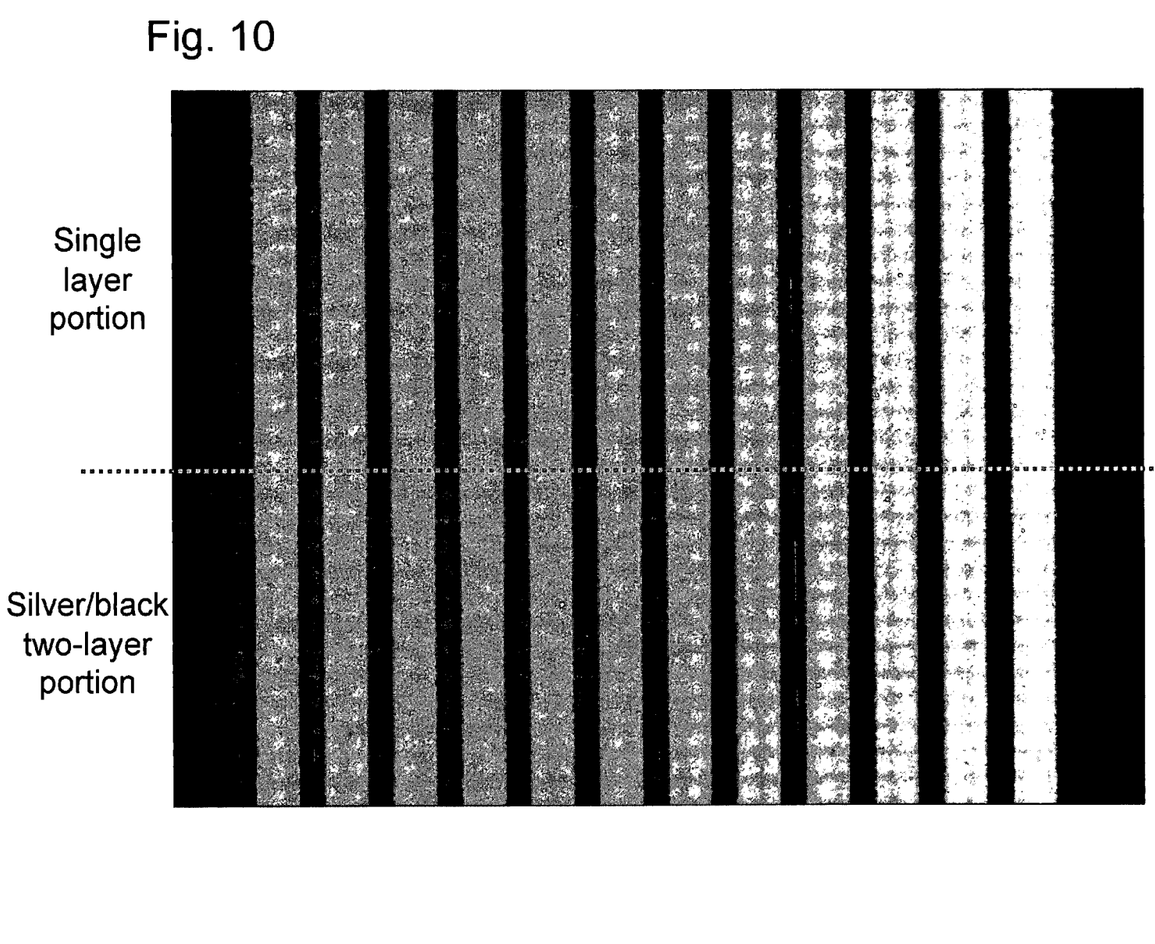
FIG. 10 is a photograph of the pattern of Example 7. The top portion indicates a single layer, and the bottom portion indicates a silver/black two layer portion.
Figure 11:
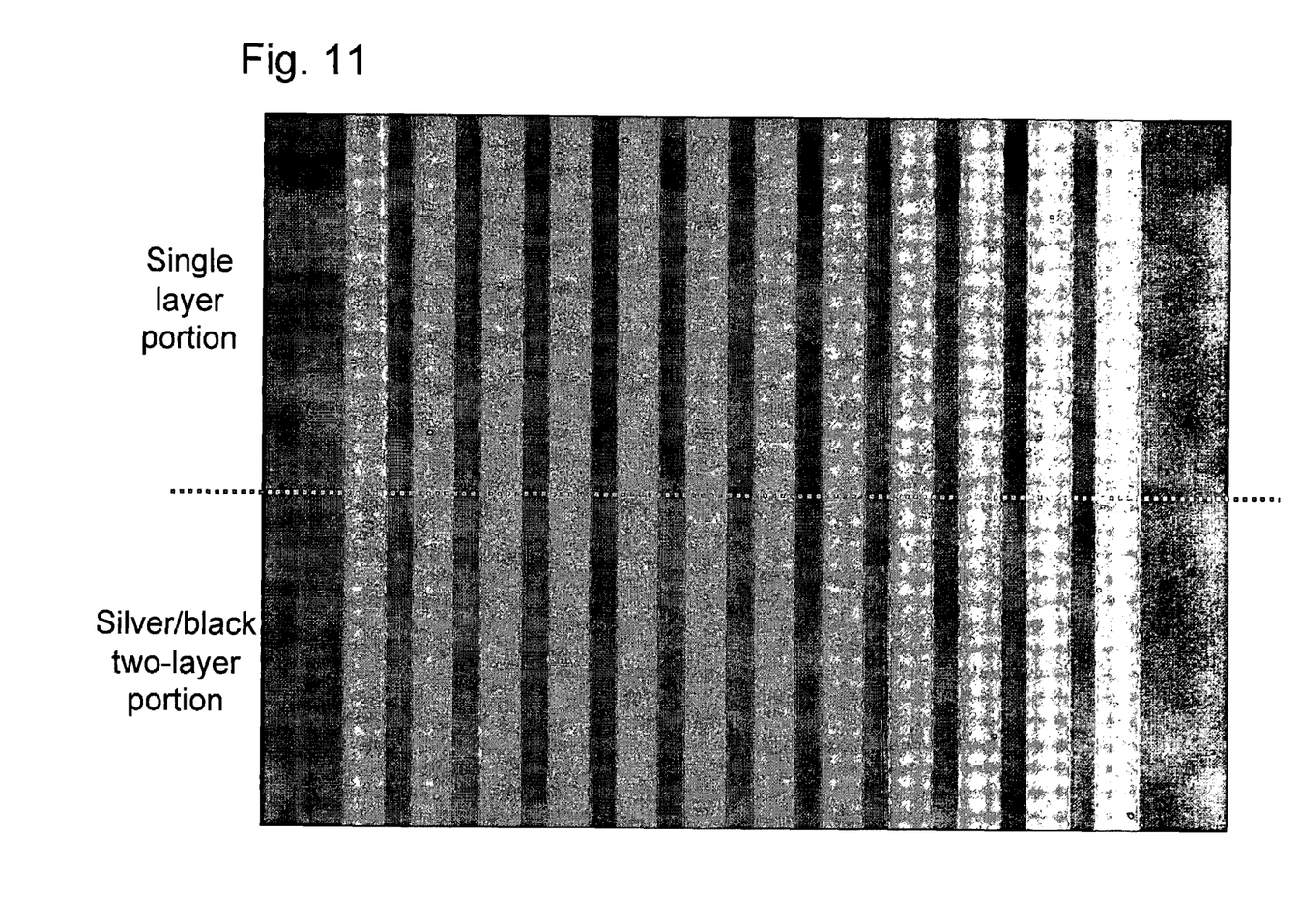
FIG. 11 is a photograph of the pattern of Example 8. The top portion indicates a single layer, and the bottom portion indicates a silver/black two layer portion.

Photographs depicting the patterns of Comparative Example 2 and Examples 4 to 8 are shown in FIGS. 6 to 11 for reference purposes. FIG. 6 is a photograph of the pattern of Comparative Example 2. FIG. 7 is a photograph of the pattern of Example 4. FIG. 8 is a photograph of the pattern of Example 5. FIG. 9 is a photograph of the pattern of Example 6. FIG. 10 is a photograph of the pattern of Example 7. FIG. 11 is a photograph of the pattern of Example 8. As shown in FIGS. 6 to 11, the addition of carbon black can be seen to result in narrow line thickness even if the exposure level is increased in a lead-free system as well.

What is claimed is:
1. A photosensitive, photo-patternable, conductive paste for electrode formation, comprising: conductive metal par- ticles, a glass binder, a monomer, a photoinitiator, an organic polymer binder, an organic medium and carbon black, wherein the content of the carbon black is 0.01 to 0.5 wt % based on the total paste weight, wherein the monomer content is 3-10 wt % of the total paste weight and wherein the monomer compound comprises one or more polymerizable ethylene group(s) and a compound containing at least one addition-polymerizable ethylenically unsaturated group, and wherein the glass binder is 1-10% of the weight % of the total paste weight and is composed of:

| | |
|---|---|
| 55-85 wt % | $Bi_2O_3$ |
| 0-20 wt % | $SiO_2$ |
| 0-5 wt % | $Al_2O_3$ |
| 2-20 wt % | $B_2O_3$ |
| 0-20 wt % | ZnO |
| 0-15 wt % | one or more of oxides selected from BaO, CaO, and SrO |
| 0-3 wt % | one or more of oxides selected from $Na_2O$, $K_2O$, $Cs_2O$ and $Li_2O$. |

2. A photosensitive, photo-patternable, conductive paste for electrode formation, comprising: conductive metal particles, a glass binder, a monomer, a photoinitiator, an organic polymer binder, an organic medium and carbon black, wherein the content of the carbon black is 0.01 to 0.5 wt % based on the total paste weight;
wherein the monomer content is 3-10 wt % of the total paste weight and wherein the monomer comprises one or more polymerizable ethylene group(s) and a compound containing at least one addition-polymerizable ethylenically unsaturated group.

3. The photosensitive conductive paste for electrode formation according to claims 1 or 2 wherein the conductive particles are selected from the group consisting of gold, silver, platinum, palladium, copper and combinations thereof.

4. The photosensitive conductive paste for electrode formation according to claim 1, wherein the conductive metal particles are silver particles.

5. An electrode formed using the conductive paste according to claim 1 or claim 2.

6. A PDP comprising the electrode according to claim 5.

7. The photosensitive, photo-patternable conductive paste of claim 2 wherein at least 80 percent by weight of the conductive metal particles present in the composition fall within a 0.5-10 μm range.

* * * * *